United States Patent
Goel et al.

(10) Patent No.: US 10,446,201 B2
(45) Date of Patent: Oct. 15, 2019

(54) DISTRIBUTED GLOBAL-BITLINE KEEPER/PRECHARGE/HEADER CIRCUIT FOR LOW VOLTAGE OPERATION

(71) Applicant: Samsung Electronics Co., Ltd., Suwon-si, Gyeonggi-do (KR)

(72) Inventors: Sumeer Goel, Austin, TX (US); Prashant Kenkare, Austin, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/716,507

(22) Filed: Sep. 26, 2017

(65) Prior Publication Data

US 2018/0374519 A1  Dec. 27, 2018

Related U.S. Application Data

(60) Provisional application No. 62/525,180, filed on Jun. 26, 2017.

(51) Int. Cl.
| | | |
|---|---|---|
| *G11C 7/12* | (2006.01) | |
| *G11C 7/10* | (2006.01) | |
| *G11C 7/18* | (2006.01) | |
| *G11C 11/419* | (2006.01) | |
| *G11C 5/14* | (2006.01) | |

(52) U.S. Cl.
CPC ............ *G11C 7/12* (2013.01); *G11C 7/1048* (2013.01); *G11C 7/18* (2013.01); *G11C 11/419* (2013.01); *G11C 5/14* (2013.01)

(58) Field of Classification Search
CPC .. G11C 7/12; G11C 5/14; G11C 5/144; G11C 5/147; G11C 7/1048; G11C 7/18
See application file for complete search history.

(56) References Cited

U.S. PATENT DOCUMENTS

| | | | |
|---|---|---|---|
| 8,508,275 B2 | 8/2013 | Sathianthan | |
| 8,614,927 B2 | 12/2013 | Lin et al. | |
| 8,750,053 B2 | 6/2014 | Chen et al. | |
| 8,848,413 B2 | 9/2014 | Donkoh | |
| 2007/0280030 A1* | 12/2007 | Ramaraju | G11C 7/02 365/230.06 |
| 2011/0128807 A1 | 6/2011 | Sharma et al. | |
| 2014/0126273 A1* | 5/2014 | Behrends | G11C 7/12 365/154 |
| 2016/0365845 A1 | 12/2016 | Kim | |
| 2018/0226122 A1* | 8/2018 | Schaefer | G11C 11/419 |

* cited by examiner

*Primary Examiner* — David Lam
(74) *Attorney, Agent, or Firm* — Renaissance IP Law Group LLP (57) ABSTRACT

According to one general aspect, an apparatus may include a global bit line, and a plurality of memory banks. The global bit line may be configured to facilitate a memory access. Each memory bank may include a local keeper-precharge circuit coupled between a power supply and the global bit line, and a control circuit configured to control, at least in part, the local keeper-precharge circuit.

20 Claims, 8 Drawing Sheets

DISTRIBUTED GLOBAL-BITLINE KEEPER/PRECHARGE/HEADER CIRCUIT FOR LOW VOLTAGE OPERATION

CROSS-REFERENCE TO RELATED APPLICATION

This application claims priority under 35 U.S.C. § 119 to Provisional Patent Application Ser. No. 62/525,180, entitled "DISTRIBUTED GLOBAL-BITLINE KEEPER/PRE-CHARGE/HEADER CIRCUIT FOR LOW VOLTAGE OPERATION" filed on Jun. 26, 2017. The subject matter of this earlier filed application is hereby incorporated by reference.

TECHNICAL FIELD

The present disclosure is generally related to circuits. In particular, the present disclosure relates to a system and method for a distributed global bit line keeper/precharge/header circuit for low voltage operation.

BACKGROUND

A memory bank is generally a logical unit of storage in electronics, which is hardware-dependent. In a computer, for example, the memory bank may be determined by the physical organization of the hardware memory. In a typical static random-access memory (static RAM or SRAM), a bank may include of multiple rows and columns of storage units, and is usually spread out across circuits. An SRAM is a type of semiconductor memory that uses bi-stable latching circuitry (e.g., a flip-flop or a portion thereof) to store each bit. In a single read or write operation, generally only one bank is accessed. Often a memory may be referred to as a register file.

Often bit cell based register files are typically organized in multiple array banks. Each bank may be organized with multiple bit-cells on a local bit line. Wherein the bit line is local to the bank. Generally, a bit line conveys information when a memory access (e.g., read, write) occurs. Each bank may be connected to a dynamic global bit line that runs through or is included by each bank (hence, the global nature of the bit-line).

Generally, the global bit line is attached to two circuits. A keeper or pull-down device which serves the purpose of retaining the state of the global bit line when it is not actively driven. And a separate precharge device that pulls the global bit line "high" or up after the evaluation phase of the memory access completes.

Often the demands placed on the global bit line cause issues with the register file. For example, the keeper device is required to work across a wide range of process, voltage and temperature (PVT) variations, and prevent the global bit line from leaking current and transitioning to "low" when it is not desired. In another example, a contention may exist between the keeper device (pulling the global bit line "high") and a bank's bit line pull down device (pulling the global bit line "low"). Often this limits the minimum voltage or lowest operating voltage, of the SRAM.

Likewise, issues often exist with the precharge device. The global bit line precharge device is usually placed at the far end of a long wire (the global bit line) that spans the width of the memory and connects multiple banks. The precharge device frequently has to pull the global bit line "high" through a fairly large resistance-capacitance (RC) network. This generally results in a high precharge time, which limits the maximum operating frequency of the memory. In addition, the global bit line precharge device is usually a large device to supply sufficient charge to the large global bit line capacitance. As a result, during the portion of a memory access, a large current often flows through the precharge portion putting stress on the power supply grid.

SUMMARY

According to one general aspect, an apparatus may include a global bit line, and a plurality of memory banks. The global bit line may be configured to facilitate a memory access. Each memory bank may include a local keeper-precharge circuit coupled between a power supply and the global bit line, and a control circuit configured to control, at least in part, the local keeper-precharge circuit.

According to another general aspect, an apparatus may include a static random access memory (SRAM) circuit configured to contention free operation and including a plurality of memory banks. Each memory bank may include a local field-effect transistor stack, having two transistors coupled in series between a power supply and a global bit line, and a local control circuit configured to control, at least in part, the local stack.

According to another general aspect, an apparatus may include a random access memory (RAM) circuit. The RAM may include a plurality of memory banks, each configured to store, at least, a respective bit of data; a global bit line configured to facilitate a memory access to the RAM circuit; a distributed keeper circuit configured to, based upon a control signal, either hold the global bit line at a first predefined state or allow contention-free transition of the global bit line from the first predefined state to a second predefined state, and wherein the distributed keeper circuit is distributed amongst the plurality of memory banks; and a distributed precharge circuit configured to charge the global bit line to the first predefined state, and wherein the distributed precharge circuit is distributed amongst the plurality of memory banks.

The details of one or more implementations are set forth in the accompanying drawings and the description below. Other features will be apparent from the description and drawings, and from the claims.

A system and/or method for a distributed global bit line keeper/precharge/header circuit for low voltage operation, substantially as shown in and/or described in connection with at least one of the figures, as set forth more completely in the claims.

BRIEF DESCRIPTION OF THE DRAWINGS

Like reference symbols in the various drawings indicate like elements.

DETAILED DESCRIPTION

Various example embodiments will be described more fully hereinafter with reference to the accompanying drawings, in which some example embodiments are shown. The present disclosed subject matter may, however, be embodied in many different forms and should not be construed as limited to the example embodiments set forth herein. Rather, these example embodiments are provided so that this disclosure will be thorough and complete, and will fully convey the scope of the present disclosed subject matter to those skilled in the art. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on", "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, and so on may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present disclosed subject matter.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

Likewise, electrical terms, such as "high" "low", "pull up", "pull down", "1", "0" and the like, may be used herein for ease of description to describe a voltage level or current relative to other voltage levels or to another element(s) or feature(s) as illustrated in the figures. It will be understood that the electrical relative terms are intended to encompass different reference voltages of the device in use or operation in addition to the voltages or currents depicted in the figures. For example, if the device or signals in the figures are inverted or use other reference voltages, currents, or charges, elements described as "high" or "pulled up" would then be "low" or "pulled down" compared to the new reference voltage or current. Thus, the exemplary term "high" may encompass both a relatively low or high voltage or current. The device may be otherwise based upon different electrical frames of reference and the electrical relative descriptors used herein interpreted accordingly.

The terminology used herein is for the purpose of describing particular example embodiments only and is not intended to be limiting of the present disclosed subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosed subject matter.

Unless otherwise defined, all terms (including technical and scientific terms) used herein have the same meaning as commonly understood by one of ordinary skill in the art to which this disclosed subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 1:
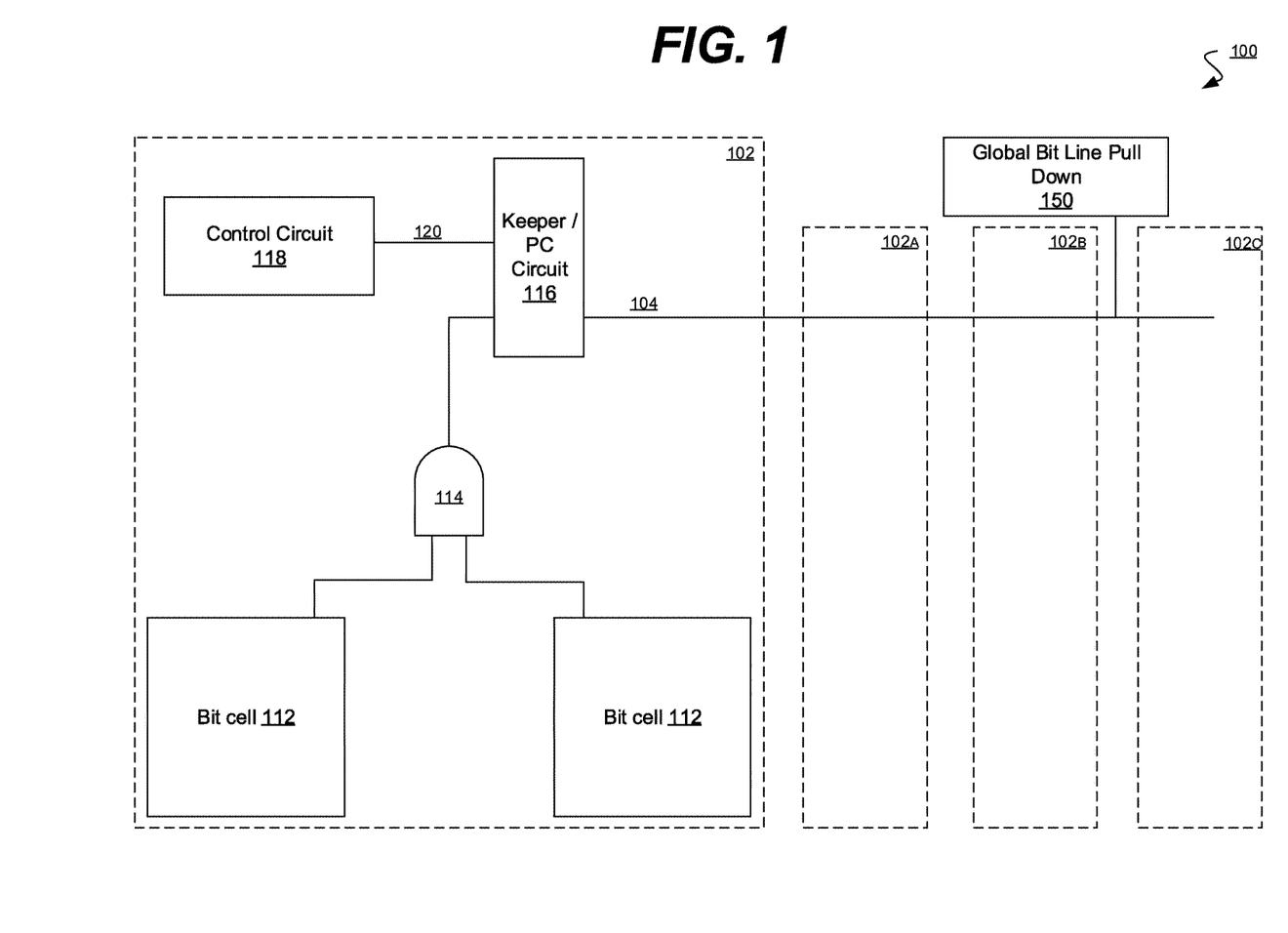
FIG. 1 is a block diagram of an example embodiment of a system in accordance with the disclosed subject matter.

FIG. 1 is a block diagram of an example embodiment of a system 100 in accordance with the disclosed subject matter. In the illustrated embodiment, the system 100 may include a memory circuit configured to store bits of data. In various embodiments, the system 100 may be included as part of a system-on-a-chip (SoC), central processor unit (CPU), specialized memory circuit or other computing device.

In various embodiments, the system 100 may include a plurality of memory banks 102 (e.g., banks 102, 102A, 102B, and 102C). Each memory bank 102 may be configured to store at least one bit of data. While only the internals of memory bank 102 are illustrated, it is understood that the memory banks 102A, 102B, and 102C may include similar or identical circuits. It is also understood that while only four banks are shown, in various embodiments, any number of banks may be employed in the system 100.

In various embodiments, the system 100 may include a global bit line 104. In various embodiments, the global bit line 104 may intersect or be included, in part, by each of the plurality of memory banks 102. The global bit line 104 may be configured to facilitate a memory access. In a traditional system, the global bit line 104 may be coupled with a keeper circuit and a centralized precharge circuit, as described above. The global bit line 104 may also be coupled with a global bit line pull down device 150.

However, in the illustrated embodiment, each memory bank 102 may include a local keeper/precharge circuit 116. In this context, the term local may refer to being localized to or associated with an individual or respective memory bank 102. In such an embodiment, the precharge function or circuit may be distributed across multiple memory banks 102, as opposed to a large centralized precharge circuit. Likewise, the keeper function or circuit may be distributed across multiple memory banks 102. In the illustrated embodiment, the distributed or localized keeper/precharge circuits 116 may be configured to perform, at least in part, the functions of the traditional centralized keeper circuits and precharge circuits, as described above.

In the illustrated embodiment, each memory bank 102 may include a control circuit 118. In such an embodiment, the control circuit 118 may be configured to control, at least in part, the local keeper/precharge circuit 116. In various embodiments, the control circuit 118 may be configured to prevent or reduce contention between the local keeper/precharge circuit 116 and other portions of the memory bank 102 or other memory banks (e.g., memory banks 102A, 102B, and 102C). In another embodiment, the control circuit 118 can also be found physically outside each memory bank 102. In such an embodiment, the control circuit 118 may be global.

In the illustrated embodiment, the memory bank 102 may also include one or more bit cells 112. In the illustrated embodiment, the memory bank 102 may include a left and right bit cell 112, which may be mirror versions of each other. In such an embodiment, each bit cell 112 may store the same bit of data. In various embodiments, the system 100 may include a bit cell combiner 114 (e.g., an NAND gate or circuit). It is understood that the above is merely one illustrative example to which the disclosed subject matter is not limited.

Figure 2:
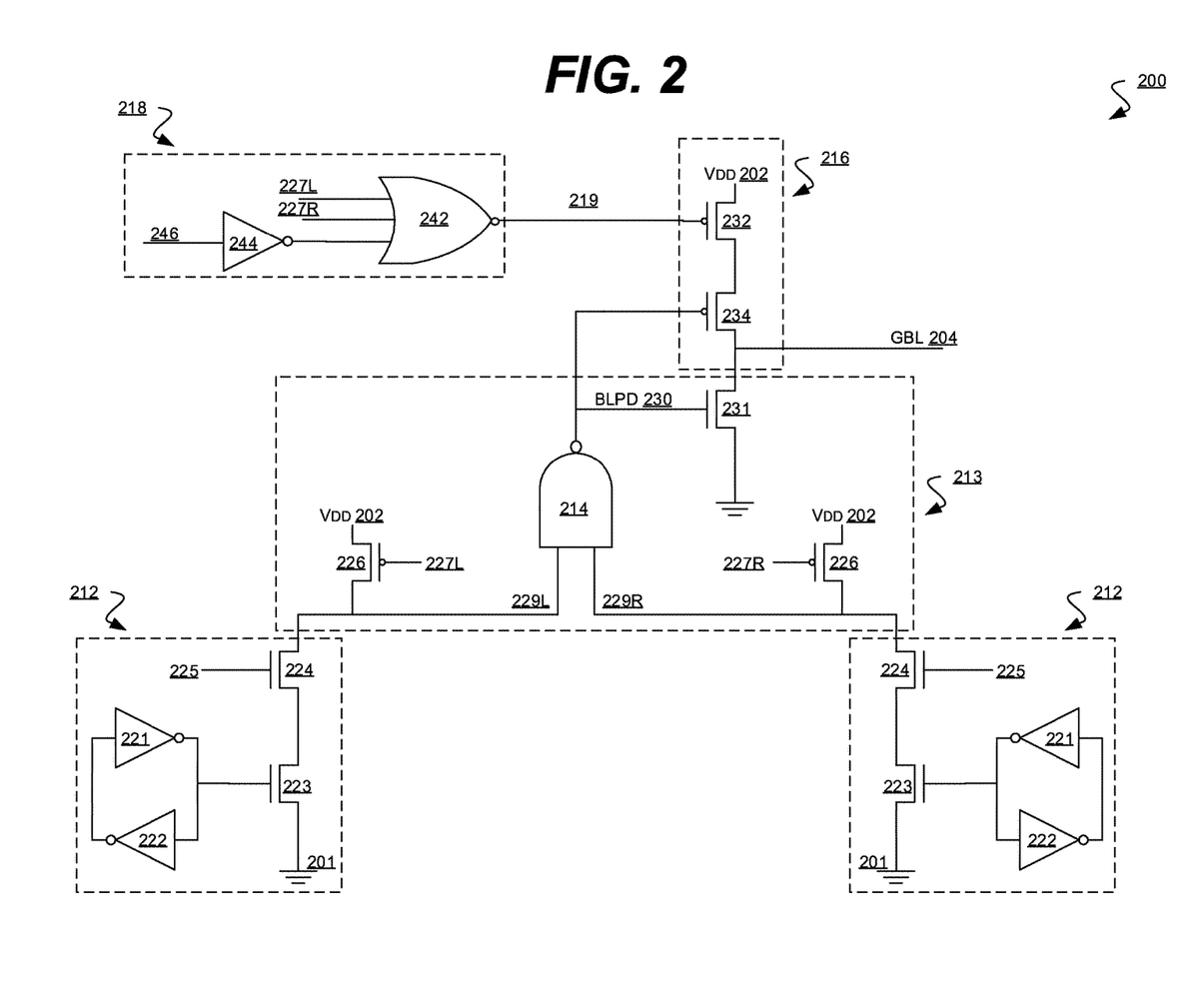
FIG. 2 is a circuit diagram of an example embodiment of a system in accordance with the disclosed subject matter.

FIG. 2 is a circuit diagram of an example embodiment of a system 200 in accordance with the disclosed subject matter. In the illustrated embodiment, the system 200 may include a memory circuit configured to store bits of data. In the illustrated embodiment, a single memory bank may be shown. The illustrated memory bank may be one of a plurality of memory banks (e.g., as shown in FIG. 1). In various embodiments, the system 200 may be included as part of a system-on-a-chip (SoC), central processor unit (CPU), specialized memory circuit or other computing device.

In the illustrated embodiment, the memory bank or system 200 may include a plurality of bit cells 212 (e.g., a left and right bit cell), local keeper/precharge circuit 216, a control circuit 218, and a portion of a global bit line (GBL) 204. In various embodiments, the system 200 may also include bit cell combiner 214 and its associated circuitry.

In the illustrated embodiment, each bit cell 212 may include a pair of inverters 221 and 222 coupled so as to feedback upon each other and store data. The bit cells 212 may also include a data n-channel metal-oxide-semiconductor field-effect transistor (NMOS) transistor 223 coupled between a ground voltage 201 and a word line NMOS transistor 224. The data NMOS transistor 223 may be coupled with the inverters 221 and 222 to read and write data to/from the inverters 221 and 222. In the illustrated embodiment, the word line NMOS transistor 224 may be coupled or controlled by the word line signal 225.

It is noted that the bit cells shown (e.g., bit cells 212) are not a complete 8 transistor bit cell often employed in a memory circuit. For simplicity of presentation, the storage latch and read port devices are only shown. It is understood that the above is merely one illustrative example to which the disclosed subject matter is not limited.

In various embodiments, each bit cell 212 may output a local bit line (LBL), shown as LBLs 229L and 229R. These LBLs 229L and 229R may be coupled between the word line NMOS transistor 224 and the bit cell combiner 214 (e.g., NAND gate or circuit). Those skilled in the art will recognize that in typical operation only one of the two bit cells 212 will be activated. For example, word line 225 associated with the right bit cell is independent from word line 225 associated with the left bit cell. Both these word lines 225 cannot be in the "high" state at the same time. Similarly, signals 227L and 227R cannot be in the "high" state at the same time during regular operation. Hence, for the case where the left side is activated, signal 227L will be in the "high" state while signal 227R will be in the "low" state. LBL 229R will remain in the "high" or precharged state thus ensuring that signal 230 represents an inverted state relative to LBL 229L. In various embodiments, a local precharge circuit 226 may be coupled with the local bit line 229. In such an embodiment, each local precharge circuit 226 may include a p-channel metal-oxide-semiconductor field-effect transistor (PMOS) transistor. The local precharge circuit 226 may be coupled between the local bit line 229 and a voltage supply (Vdd) 202.

In the illustrated embodiment, the system 200 may include a local bit line pull down circuit 231. In various embodiments, the local bit line pull down circuit 231 may include an NMOS transistor coupled between the keeper/precharge circuit 216 and the ground voltage 201. In such an embodiment, the local bit line pull down circuit 231 may be controlled by a local bit line pull down signal 230 output from the bit cell combiner 214. In such an embodiment, the bit cell combiner 214, the local precharge circuits 226, and the local bit line pull down circuit 231 may be included in a local evaluation circuit 213.

In the illustrated embodiment, the system 200 may include a local keeper/precharge circuit 216. In various embodiments, the local keeper/precharge circuit 216 may be coupled between the voltage supply Vdd 202 and the global bit line 204. In various embodiments, the keeper/precharge circuit 216 may include a portion or circuit 232, and a portion or circuit 234. In some embodiments, these portions 232 and 234 may be stacked or placed in series.

In one such embodiment, the portion 232 may include a PMOS transistor coupled between the power supply Vdd 202 and the portion 234. In some embodiments, the portion 232 may be controlled, at least in part, by a keeper enable or control signal 219 that is output from the control circuit 218. In various embodiments, the portion 232 may be configured to hold the global bit line 204 "high" when the local bit line 229 stays "high", and to disengage or no longer hold the global bit line 204 "high" when the local bit line 229 is pulled "low". In such an embodiment, the portion 232 may be configured to remove, reduce, or avoid contentions between the two signals 204 and 229. In various embodiments, the portion 232 may be self-timed relative to the global precharge signal 246.

In the illustrated embodiment, the system 200 may include a control circuit 218 which outputs the keeper enable or control signal 219. In various embodiments, the control circuit 218 may include a self-timing circuit 242 (e.g., a NOR gate or circuit) configured to turn on the portion 232 if any of the local bit lines 227L and 227R or a global precharge signal 246 is disabled (e.g., "high"). In the illustrated embodiment, the local bit lines 227L and 227R, and global precharge signal 246 may be inverted or low-active. In one embodiment, the control circuit 218 may include an inverter 224 to un-invert the global precharge signal 246. It is understood that the above is merely one illustrative example to which the disclosed subject matter is not limited.

In such an embodiment, the portion or circuit 234 may include a PMOS transistor coupled between the portion 232 and the global bit line 204. In various embodiments, the portion 234 may be controlled, at least in part, by the output of the bit cell combiner 214 or local bit line pull down signal 230. In such an embodiment, after the evaluation phase, the portion or circuit 234 may turn on and drive the global bit line 204. In various embodiments, the local keeper/precharge circuit of each memory bank (as a whole) may act as a distributed precharge circuit for the plurality of memory banks. In such an embodiment, the distributed precharge circuit, associated with each memory bank, may substantially simultaneously charge the global bit line 204, system-wide, to a first predefined state (e.g., "high").

In the illustrated embodiment, the system 200 may provide a substantially contention free form of read operation for an SRAM register file. The system 20 may also provide or include a way to precharge the global bit line 204 in a distributed manner.

Figure 3A:
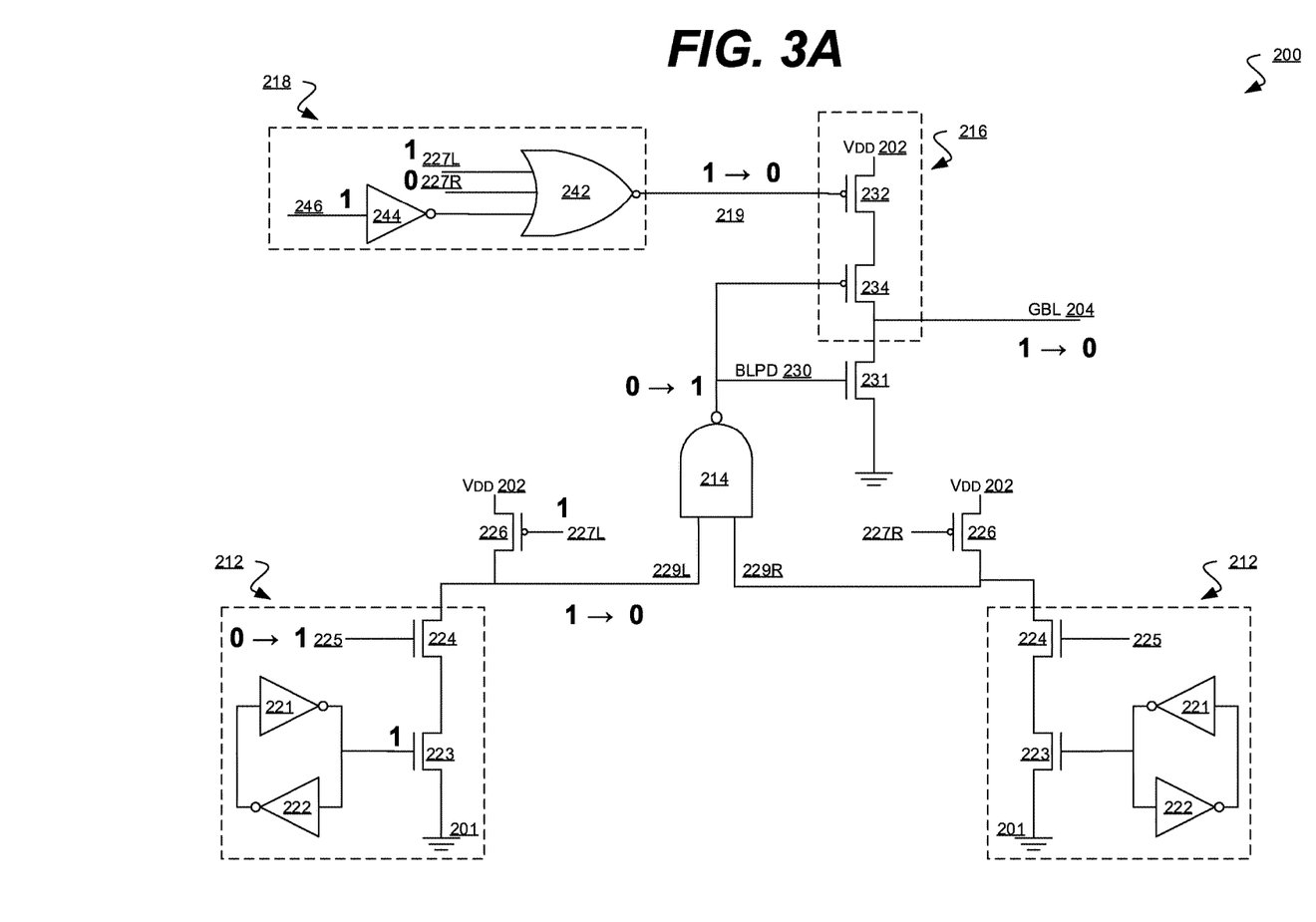
FIG. 3A is a circuit diagram of an example embodiment of a system in accordance with the disclosed subject matter.

FIG. 3A is a circuit diagram of an example embodiment of a system 200 in accordance with the disclosed subject matter. In the illustrated embodiment, the system 200 may include a memory circuit configured to store bits of data. In the illustrated embodiment, a single memory bank may be shown. The illustrated memory bank may be one of a plurality of memory banks (e.g., as shown in FIG. 1). In various embodiments, the system 200 may be included as part of a system-on-a-chip (SoC), central processor unit (CPU), specialized memory circuit or other computing device.

In the illustrated embodiment, the system 200 may store a 1 value (specifically in the inverters 221 and 222 of the bit cells 212). In the illustrated embodiment, a read operation or memory access may occur. The illustration shows the values (e.g., 1, 0) of the various signals. Values show with an arrow (e.g., 1→0) represent the value transitioning from a first value (e.g., 1) to a second value (e.g., 0). Further, mirrored (e.g., those of the right bit cell 212) or non-illustrative values are not shown.

In the illustrated embodiment, during the read operation, the global precharge signal 246 and one of the local precharge charge signals 227L may de-assert, which as inverted signals means the signals 246 & 227L have value 1. This may turn the portion or transistor 232 "ON". This may enable the particular memory bank. In FIG. 3C, it is shown how an unselected memory bank is disabled when the portion 232 is turned "OFF".

In the illustrated embodiment, as the word line 225 switches from low (0) to high (1), the local bit line 229L may pull "low" (from 1 to 0). This may cause the portion 234 to turn "OFF", disabling the keeper/precharge circuit 216. This may allow the global pull-down device 231 to write to the GBL 204 without contention (from the portion 234).

Figure 3B:
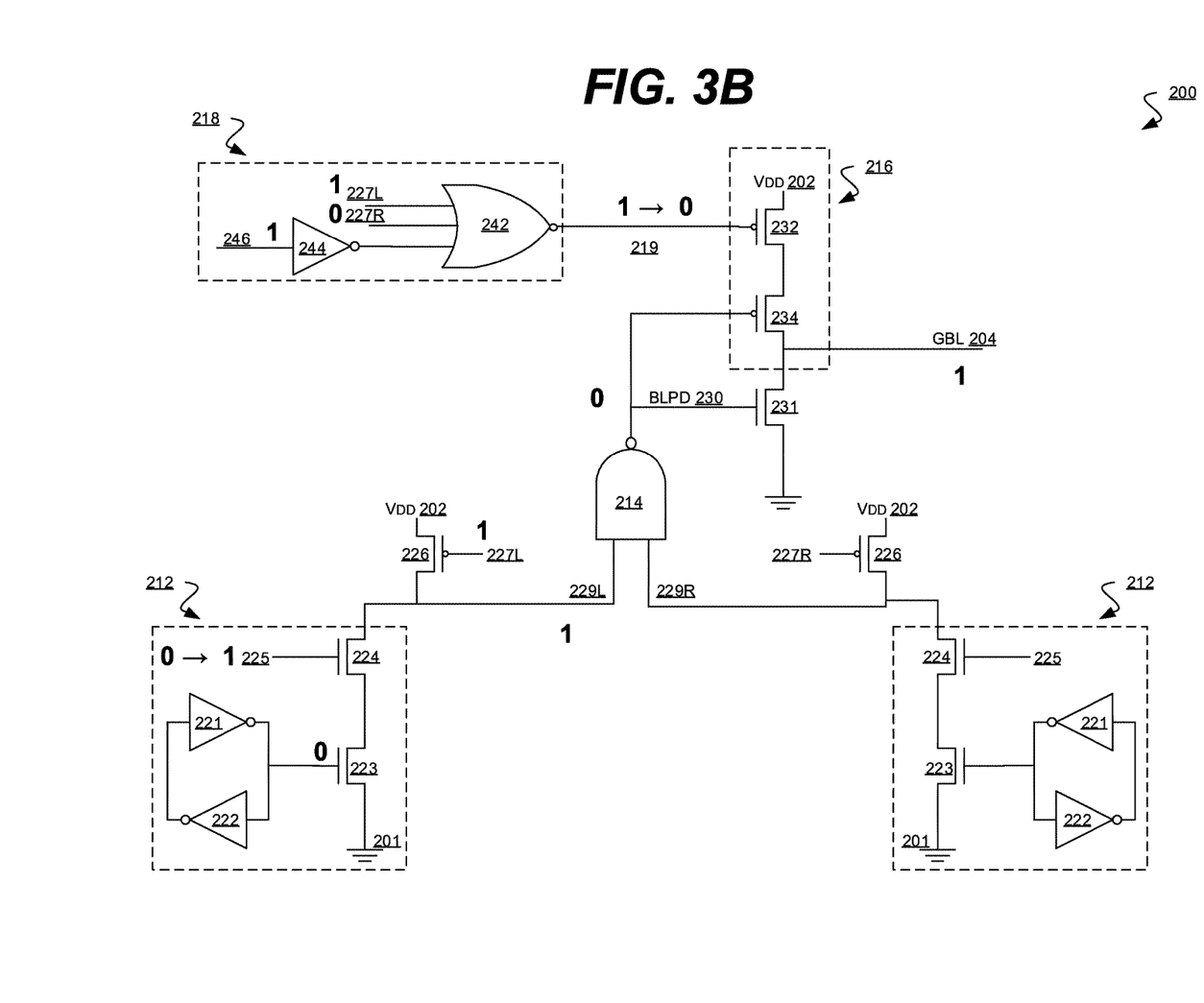
FIG. 3B is a circuit diagram of an example embodiment of a system in accordance with the disclosed subject matter.
Figure 3C:
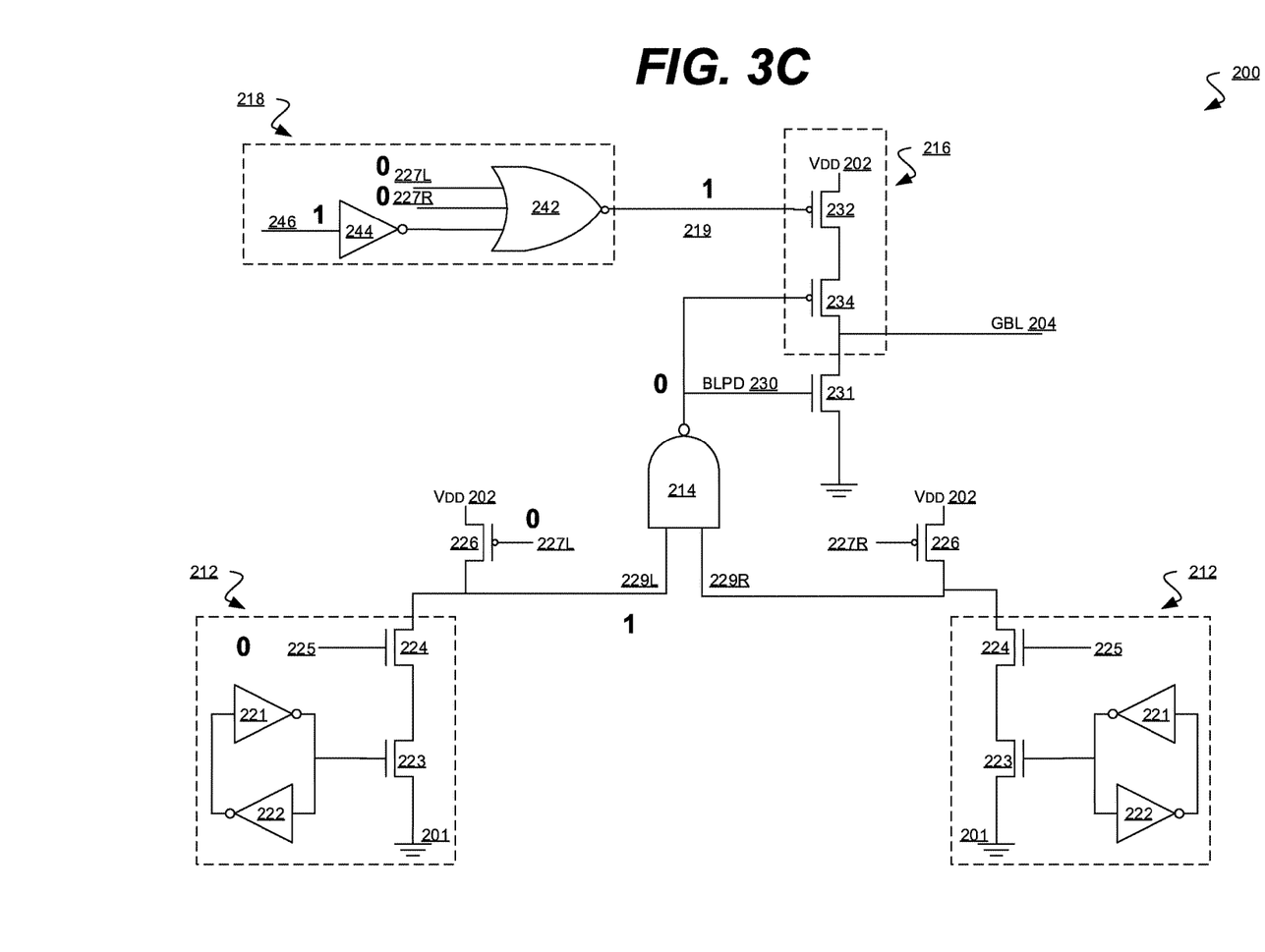
FIG. 3C is a circuit diagram of an example embodiment of a system in accordance with the disclosed subject matter.

FIG. 3B is a circuit diagram of an example embodiment of a system 200 in accordance with the disclosed subject matter. In the illustrated embodiment, the system 200 may include a memory circuit configured to store bits of data. In the illustrated embodiment, a single memory bank may be shown. The illustrated memory bank may be one of a plurality of memory banks (e.g., as shown in FIG. 1). In various embodiments, the system 200 may be included as part of a system-on-a-chip (SoC), central processor unit (CPU), specialized memory circuit or other computing device.

In the illustrated embodiment, the system 200 may store a 0 value (specifically in the inverters 221 and 222 of the bit cells 212). In the illustrated embodiment, a read operation or memory access may occur. The illustration shows the values (e.g., 1, 0) of the various signals. Values shown with an arrow (e.g., 1→0) represent the value transitioning from a first value (e.g., 1) to a second value (e.g., 0). Further, mirrored (e.g., those of the right bit cell 212) or non-illustrative values are not shown.

In the illustrated embodiment, during the read operation, the global precharge signal 246 and one of the local precharge charge signals 227L may de-assert, which as inverted signals means the signals 246 & 227L have value 1. This may turn the portion or transistor 232 "ON". This may enable the particular memory bank. In FIG. 3C, it is shown how an unselected memory bank is disabled when the portion 232 is turned "OFF".

In the illustrated embodiment, as the word line 225 switches from low (0) to high (1), the local bit line 229L may remain "high" (1), and the local bit line pull down signal 230 may remain "low" (0), thus allowing portion 234 to remain "ON". The global pull-down device 231 thus remains "OFF" thereby allowing the keeper/precharge circuit 216 to maintain a 1 to the GBL 204 without contention (from the global pull-down device 231).

Further, it is seen how the local precharge signal(s) allow the portion 232 to be self-timed in order to avoid contention.

FIG. 3C is a circuit diagram of an example embodiment of a system 200 in accordance with the disclosed subject matter. In the illustrated embodiment, the system 200 may include a memory circuit configured to store bits of data. In the illustrated embodiment, a single memory bank may be shown. The illustrated memory bank may be one of a plurality of memory banks (e.g., as shown in FIG. 1). In various embodiments, the system 200 may be included as part of a system-on-a-chip (SoC), central processor unit (CPU), specialized memory circuit or other computing device.

In the illustrated embodiment, the system 200 may not be selected. Instead another memory bank (not shown) may be selected for a particular memory access. The illustration shows the values (e.g., 1, 0) of the various signals. Values show with an arrow (e.g., 1→0) represent the value transitioning from a first value (e.g., 1) to a second value (e.g., 0). Further, mirrored (e.g., those of the right bit cell 212) or non-illustrative values are not shown.

In the illustrated embodiment, during the read operation, the global precharge signal 246 de-asserts, which as an inverted signal means the signal 246 has the value 1. Conversely, as the illustrated memory bank is not selected, the local precharge signals 227L and 227R, may be asserted or at 0. This may turn the portion or transistor 232 of the unselected memory bank "OFF". This may disable the particular memory bank.

In such an embodiment, the local keeper/precharge circuit 216 may be configured to enable the respective memory bank only when the respective memory bank is performing a memory access, and disable the respective memory bank only when the respective memory bank is not performing a memory access.

Figure 3D:
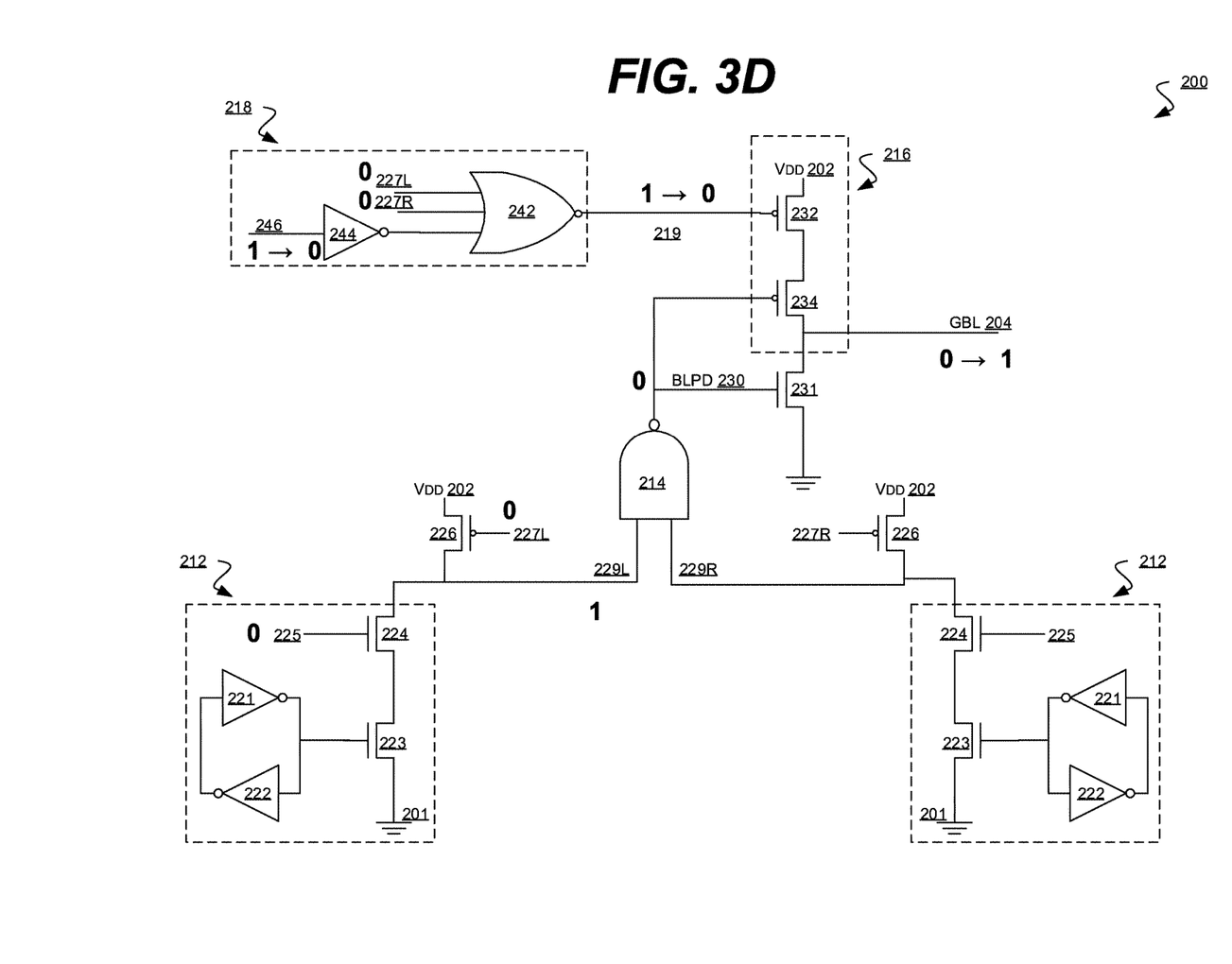
FIG. 3D is a circuit diagram of an example embodiment of a system in accordance with the disclosed subject matter.

FIG. 3D is a circuit diagram of an example embodiment of a system 200 in accordance with the disclosed subject matter. In the illustrated embodiment, the system 200 may include a memory circuit configured to store bits of data. In the illustrated embodiment, a single memory bank may be shown. The illustrated memory bank may be one of a plurality of memory banks (e.g., as shown in FIG. 1). In various embodiments, the system 200 may be included as part of a system-on-a-chip (SoC), central processor unit (CPU), specialized memory circuit or other computing device.

In the illustrated embodiment, the system 200 may act as part of a distributed precharge network. In such an embodiment, the illustrated memory bank may work in concert with other memory banks (e.g., those shown in FIG. 1) to precharge the global bit line 204.

The illustration shows the values (e.g., 1, 0) of the various signals. Values show with an arrow (e.g., 1→0) represent the value transitioning from a first value (e.g., 1) to a second value (e.g., 0). Further, mirrored (e.g., those of the right bit cell 212) or non-illustrative values are not shown.

In the illustrated embodiment, after the evaluation phase of the memory access the local precharge signals 227L and 227R assert "low" or 0. This is followed by the global precharge signal 246 also asserting to transitioning to "low" or 0. This may turn the portion or transistor 232 of the unselected memory bank "ON".

In the illustrated embodiment, the local word line signal 225 may be 0, which in turn causes the bit line pull down signal 230 to be 0. The bit line pull down transistor 231 may turn "OFF" and transistor 234 may turn "ON". This may cause the global bit line 204 to be pulled up (via the keeper/precharge circuit 216) to a 1.

In such an embodiment, the many local keeper/precharge circuits 216 through the plurality of memory banks may act as a distributed precharge circuit. However, by being distributed throughout the plurality of memory banks, the local keeper/precharge circuits 216 may be relatively small and not placed, where a traditional single precharge circuit is, at the far end of a long global precharge wire. This may have the benefit of breaking up the large RC network and result in lower precharge times, thus reducing the limit on the maximum operating frequency. Further, a distributed precharge circuit may reduce the stress placed on the power supply grid. It is understood that the above are merely a few illustrative examples to which the disclosed subject matter is not limited.

Figure 4:
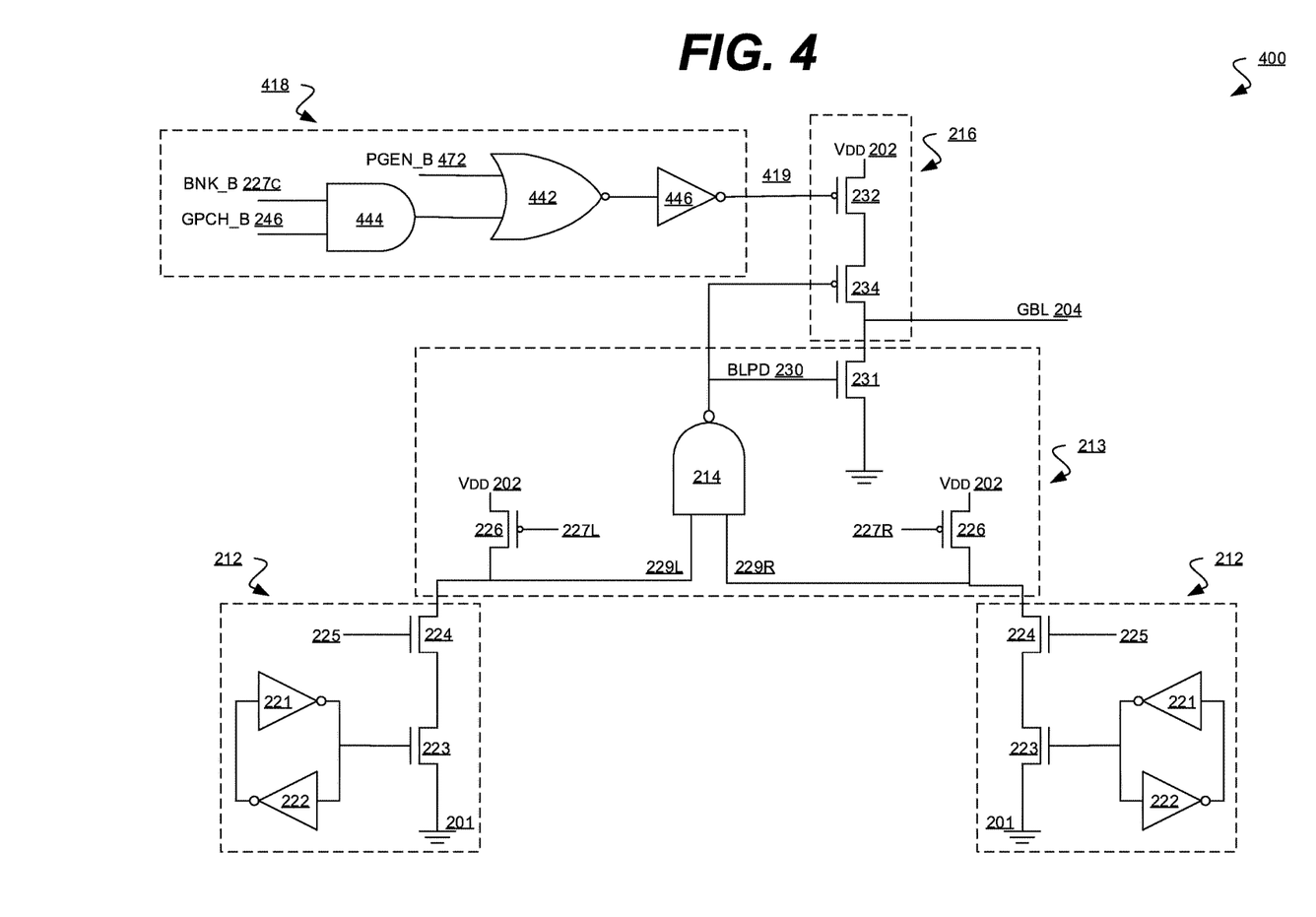
FIG. 4 is a circuit diagram of an example embodiment of a system in accordance with the disclosed subject matter.

FIG. 4 is a circuit diagram of an example embodiment of a system 400 in accordance with the disclosed subject matter. In the illustrated embodiment, the system 200 may include a memory circuit configured to store bits of data. In the illustrated embodiment, a single memory bank may be shown. The illustrated memory bank may be one of a plurality of memory banks (e.g., as shown in FIG. 1). In various embodiments, the system 200 may be included as part of a system-on-a-chip (SoC), central processor unit (CPU), specialized memory circuit or other computing device.

In the illustrated embodiment, the system 400 may include the bit cell(s) 212, the evaluation circuit 213, and the keeper/precharge circuit 216, as described above. In the illustrated embodiment, the system 400 may also include a control circuit 418. In such an embodiment, the control circuit 418 may be configured to reduce power consumption by turning the memory bank off when not in use (or for other reasons). In such an embodiment, it may do so by using the keeper/precharge circuit 216 as a power header circuit.

In the illustrated embodiment, the control circuit 418 may receive as input the global precharge signal (or the inverse thereof, signal 246) and a memory bank selection signal (or the inverse thereof, signal 227C). In various embodiments, the inverted memory bank selection signal 227C may be, at least partially, a combination of the local precharge signals 227L and 227R. In the illustrated embodiment, the inverted global precharge signal 246 and inverted memory bank selection signal 227C may be combined (e.g., via the AND gate 444).

In the illustrated embodiment, the control circuit 418 may receive as input a power enable signal (of the inverse thereof, signal 472). In such an embodiment, the inverted power enable signal 472 may be configured to indicate when the system 400 is to be powered and when it is to be disabled. In the illustrated embodiment, the inverted power enable signal 472 and the precharge signals 246 & 227C may be combined by the NOR gate 442. The output of the NOR gate 442 may then be inverted by inverter 446 before acting as the control signal 419. It is understood that the above is merely one illustrative example to which the disclosed subject matter is not limited.

In the illustrated embodiment, if the inverted power enable signal 472 is enabled (a 0), the control signal 419 may operate much as described in reference to FIGS. 3A, 3B, 3C, and 3D, with the keeper/precharge circuit 216 keeping or precharging the global bit line 204, as described above. However, if the inverted power enable signal 472 is disabled (a 1), the control signal 419 may turn the transistor 232 "OFF", thus disconnecting the memory bank from the power supply Vdd 202 and placing it in a low power mode (e.g., a shutdown or suspended state).

Figure 5:
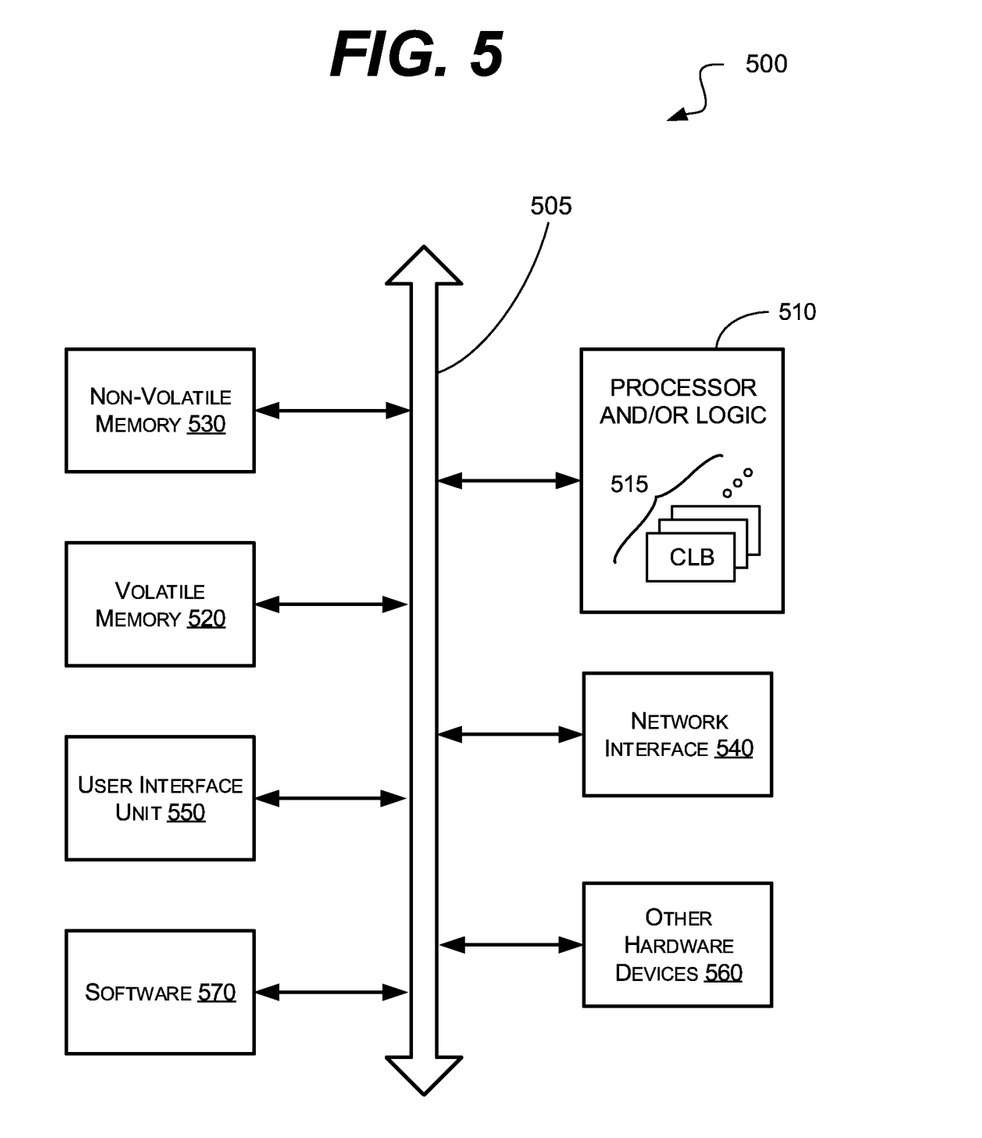
FIG. 5 is a schematic block diagram of an information processing system that may include devices formed according to principles of the disclosed subject matter.

FIG. 5 is a schematic block diagram of an information processing system 500, which may include semiconductor devices formed according to principles of the disclosed subject matter.

Referring to FIG. 5, an information processing system 500 may include one or more of devices constructed according to the principles of the disclosed subject matter. In another embodiment, the information processing system 500 may employ or execute one or more techniques according to the principles of the disclosed subject matter.

In various embodiments, the information processing system 500 may include a computing device, such as, for example, a laptop, desktop, workstation, server, blade server, personal digital assistant, smartphone, tablet, and other appropriate computers or a virtual machine or virtual computing device thereof. In various embodiments, the information processing system 500 may be used by a user (not shown).

The information processing system 500 according to the disclosed subject matter may further include a central processing unit (CPU), logic, or processor 510. In some embodiments, the processor 510 may include one or more functional unit blocks (FUBs) or combinational logic blocks (CLBs) 515. In such an embodiment, a combinational logic block may include various Boolean logic operations (e.g., NAND, NOR, NOT, XOR), stabilizing logic devices (e.g., flip-flops, latches), other logic devices, or a combination thereof. These combinational logic operations may be configured in simple or complex fashion to process input signals to achieve a desired result. It is understood that while a few illustrative examples of synchronous combinational logic operations are described, the disclosed subject matter is not so limited and may include asynchronous operations, or a mixture thereof. In one embodiment, the combinational logic operations may comprise a plurality of complementary metal oxide semiconductors (CMOS) transistors. In various embodiments, these CMOS transistors may be arranged into gates that perform the logical operations; although it is understood that other technologies may be used and are within the scope of the disclosed subject matter.

The information processing system 500 according to the disclosed subject matter may further include a volatile memory 520 (e.g., a Random Access Memory (RAM)). The information processing system 500 according to the disclosed subject matter may further include a non-volatile memory 530 (e.g., a hard drive, an optical memory, a NAND or Flash memory). In some embodiments, either the volatile memory 520, the non-volatile memory 530, or a combination or portions thereof may be referred to as a "storage medium". In various embodiments, the volatile memory 520 and/or the non-volatile memory 530 may be configured to store data in a semi-permanent or substantially permanent form.

In various embodiments, the information processing system 500 may include one or more network interfaces 540 configured to allow the information processing system 500 to be part of and communicate via a communications network. Examples of a Wi-Fi protocol may include, but are not limited to, Institute of Electrical and Electronics Engineers (IEEE) 802.11g, IEEE 802.11n. Examples of a cellular protocol may include, but are not limited to: IEEE 802.16m (a.k.a. Wireless-MAN (Metropolitan Area Network) Advanced, Long Term Evolution (LTE) Advanced, Enhanced Data rates for GSM (Global System for Mobile Communications) Evolution (EDGE), Evolved High-Speed Packet Access (HSPA+). Examples of a wired protocol may include, but are not limited to, IEEE 802.3 (a.k.a. Ethernet), Fibre Channel, Power Line communication (e.g., HomePlug, IEEE 1901). It is understood that the above are merely a few illustrative examples to which the disclosed subject matter is not limited.

The information processing system 500 according to the disclosed subject matter may further include a user interface unit 550 (e.g., a display adapter, a haptic interface, a human interface device). In various embodiments, this user interface unit 550 may be configured to either receive input from a user and/or provide output to a user. Other kinds of devices may be used to provide for interaction with a user as well; for example, feedback provided to the user may be any form of sensory feedback, e.g., visual feedback, auditory feedback, or tactile feedback; and input from the user may be received in any form, including acoustic, speech, or tactile input.

In various embodiments, the information processing system 500 may include one or more other devices or hardware components 560 (e.g., a display or monitor, a keyboard, a mouse, a camera, a fingerprint reader, a video processor). It is understood that the above are merely a few illustrative examples to which the disclosed subject matter is not limited.

The information processing system 500 according to the disclosed subject matter may further include one or more system buses 505. In such an embodiment, the system bus 505 may be configured to communicatively couple the processor 510, the volatile memory 520, the non-volatile memory 530, the network interface 540, the user interface unit 550, and one or more hardware components 560. Data processed by the processor 510 or data inputted from outside of the non-volatile memory 530 may be stored in either the non-volatile memory 530 or the volatile memory 520.

In various embodiments, the information processing system 500 may include or execute one or more software components 570. In some embodiments, the software components 570 may include an operating system (OS) and/or an application. In some embodiments, the OS may be configured to provide one or more services to an application and manage or act as an intermediary between the application and the various hardware components (e.g., the processor 510, a network interface 540) of the information processing system 500. In such an embodiment, the information processing system 500 may include one or more native applications, which may be installed locally (e.g., within the non-volatile memory 530) and configured to be executed directly by the processor 510 and directly interact with the OS. In such an embodiment, the native applications may include pre-compiled machine executable code. In some embodiments, the native applications may include a script interpreter (e.g., C shell (csh), AppleScript, AutoHotkey) or a virtual execution machine (VM) (e.g., the Java Virtual Machine, the Microsoft Common Language Runtime) that are configured to translate source or object code into executable code which is then executed by the processor 510.

The semiconductor devices described above may be encapsulated using various packaging techniques. For example, semiconductor devices constructed according to principles of the disclosed subject matter may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, a wafer-level processed stack package (WSP) technique, or other technique as will be known to those skilled in the art.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

In various embodiments, a computer readable medium may include instructions that, when executed, cause a device to perform at least a portion of the method steps. In some embodiments, the computer readable medium may be included in a magnetic medium, optical medium, other medium, or a combination thereof (e.g., CD-ROM, hard drive, a read-only memory, a flash drive). In such an embodiment, the computer readable medium may be a tangibly and non-transitorily embodied article of manufacture.

While the principles of the disclosed subject matter have been described with reference to example embodiments, it will be apparent to those skilled in the art that various changes and modifications may be made thereto without departing from the spirit and scope of these disclosed concepts. Therefore, it should be understood that the above embodiments are not limiting, but are illustrative only. Thus, the scope of the disclosed concepts are to be determined by the broadest permissible interpretation of the following claims and their equivalents, and should not be restricted or limited by the foregoing description. It is, therefore, to be understood that the appended claims are intended to cover all such modifications and changes as fall within the scope of the embodiments.

What is claimed is:

1. An apparatus comprising:
a global bit line configured to facilitate a memory access; and
a plurality of memory banks, wherein each memory bank comprises:
a local keeper-precharge circuit coupled with a power supply and directly with the global bit line and configured to precharge the global bit line, and
a control circuit configured to control, at least in part, the local keeper-precharge circuit.

2. The apparatus of claim 1, further comprising a distributed precharge circuit that includes each of the local keeper-precharge circuits.

3. The apparatus of claim 2, wherein each of the local keeper-precharge circuits is configured to substantially simultaneously charge the global bit line to a first predefined state.

4. The apparatus of claim 1, wherein the local keeper-precharge circuit is configured to, based upon a control signal, either hold the global bit line at a first predefined state or allow contention-free transition of the global bit line from the first predefined state to a second predefined state.

5. The apparatus of claim 1, wherein the local keeper-precharge circuit comprises:
a first transistor coupled between the power supply and a second transistor; and
the second transistor coupled between the first transistor and the global bit line.

6. The apparatus of claim 1, wherein the control circuit is configured to control a voltage of a control signal, based at least in part, upon a local precharge signal; and
wherein the control signal controls a portion of the local keeper-precharge circuit.

7. The apparatus of claim 1, wherein each local keeper-precharge circuit of a respective memory bank is configured to:
enable conduction between the power supply and the global bit line when the respective memory bank is performing a memory access; and
disable conduction between the power supply and the global bit line when the respective memory bank is not performing a memory access.

8. The apparatus of claim 1, wherein the local keeper precharge circuits are distributed throughout the plurality of memory banks, and, after an evaluation phase of the memory access, the local keeper-precharge circuits are configured to, as a group, precharge the global bit line.

9. The apparatus of claim 1, wherein each local keeper-precharge circuit of a respective memory bank is configured to reduce power consumption by the respective memory bank by disconnecting the global bit line from the power supply.

10. The apparatus of claim 9, wherein each respective control circuit is configured to be based, at least in part, upon a power enable signal which causes the respective local keeper-precharge circuit to disconnect the global bit line from the power supply.

11. An apparatus comprising:
a static random access memory (SRAM) circuit configured to contention free operation and including a plurality of memory banks, wherein each memory bank comprises:
a local field-effect transistor (FET) stack, having two transistors coupled in series between a power supply and a global bit line, and configured to both precharge, at least in part, and keep a state of the global-bit line, and
a local control circuit configured to control, at least in part, the local FET stack.

12. The apparatus of claim 11, further comprising a distributed precharge circuit that includes each of the local FET stacks.

13. The apparatus of claim 11, wherein the local FET stack comprises a precharge circuit configured to charge the global bit line to a first predefined state.

14. The apparatus of claim 11, wherein the local FET stack comprises a keeper circuit configured to, based upon a control signal, either hold the global bit line at a first predefined state or allow contention-free transition of the global bit line from the first predefined state to a second predefined state.

15. The apparatus of claim 11, wherein each local FET stack of a respective memory bank is configured to:
enable conduction between the power supply and the global bit line when the respective memory bank is performing a memory access; and
disable conduction between the power supply and the global bit line when the respective memory bank is not performing a memory access.

16. The apparatus of claim 11, wherein the local field-effect transistor stacks are distributed throughout the plurality of memory banks, and, after an evaluation phase of the memory access, each local transistor field-effect stack is configured to, as a group, precharge the global bit line.

17. The apparatus of claim 11, wherein the local FET stack is configured to, in a power-saving mode, disconnect the power supply from the global bit line.

18. The apparatus of claim 17, wherein each respective control circuit is configured to be based, at least in part, upon a power enable signal that causes the respective FET stack to disconnect the respective memory bank from the power supply.

19. An apparatus comprising:
a random access memory (RAM) circuit comprising:
a plurality of memory banks, each configured to store, at least, a respective bit of data;
a global bit line configured to facilitate a memory access to the RAM circuit;
a distributed keeper circuit configured to, based upon a control signal, either hold the global bit line at a first predefined state or allow contention-free transition of the global bit line from the first predefined state to a second predefined state, and wherein the distributed keeper circuit is distributed amongst the plurality of memory banks; and
a distributed precharge circuit configured to charge the global bit line to the first predefined state, and wherein the distributed precharge circuit is distributed amongst the plurality of memory banks.

20. The apparatus of claim 19, wherein each of the plurality of memory banks comprises a header circuit configured to, when in a power saving mode, disconnect the global bit line from the respective memory bank's power supply.

* * * * *